(12) United States Patent
Szczepanek et al.

(10) Patent No.: US 10,236,907 B2
(45) Date of Patent: *Mar. 19, 2019

(54) FORWARD ERROR CORRECTION (FEC) EMULATOR

(71) Applicant: INPHI CORPORATION, Santa Clara, CA (US)

(72) Inventors: Andre Szczepanek, Santa Clara, CA (US); Arash Farhoodfar, Santa Clara, CA (US); Sudeep Bhoja, San Jose, CA (US); Sean Batty, Machynlleth (GB); Shaun Lytollis, Santa Clara, CA (US)

(73) Assignee: INPHI CORPORATION, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/981,844

(22) Filed: May 16, 2018

(65) Prior Publication Data

US 2018/0262209 A1 Sep. 13, 2018

Related U.S. Application Data

(63) Continuation of application No. 15/337,136, filed on Oct. 28, 2016, now Pat. No. 9,998,146.

(51) Int. Cl.
*H03M 13/01* (2006.01)
*H03M 13/15* (2006.01)

(52) U.S. Cl.
CPC ....... *H03M 13/015* (2013.01); *H03M 13/158* (2013.01); *H03M 13/1515* (2013.01)

(58) Field of Classification Search
CPC ........... H03M 13/015; H03M 13/1515; H03M 13/158
See application file for complete search history.

(56) References Cited

U.S. PATENT DOCUMENTS

| 8,325,828 B1* | 12/2012 | Liu ..................... | H04L 27/2647 375/259 |
| 2009/0028268 A1* | 1/2009 | Locke .................. | H04L 1/0047 375/295 |
| 2009/0100314 A1* | 4/2009 | Danninger ........ | H03M 13/2732 714/755 |
| 2012/0076502 A1* | 3/2012 | Swanson ............ | H04B 10/0795 398/136 |
| 2017/0155440 A1* | 6/2017 | Sun ..................... | H04B 7/0632 |

* cited by examiner

*Primary Examiner* — Kyle Vallecillo
(74) *Attorney, Agent, or Firm* — Richard T. Ogawa; Ogawa P.C.

(57) ABSTRACT

Embodiments relate to the emulation of the effect of Forward Error Correction (FEC) codes, e.g., $GF^{10}$ Reed Solomon (RS) FEC codes, on the bit error ratio (BER) of received Pseudo-Random Binary Sequences (PRBS) patterns. In particular, embodiments group errors into RS-FEC symbols and codewords in order to determine if the errors are correctable. By emulating the error correction capabilities of FEC codes in order to determine which errors are correctable by the code, embodiments afford a more accurate representation of the post-FEC BER of RS FEC codes from links carrying PRBS patterns. This FEC code emulation provides error correction statistics, for stand-alone use or for error correction in connection with Bit Error Rate Testers (BERTs).

14 Claims, 9 Drawing Sheets

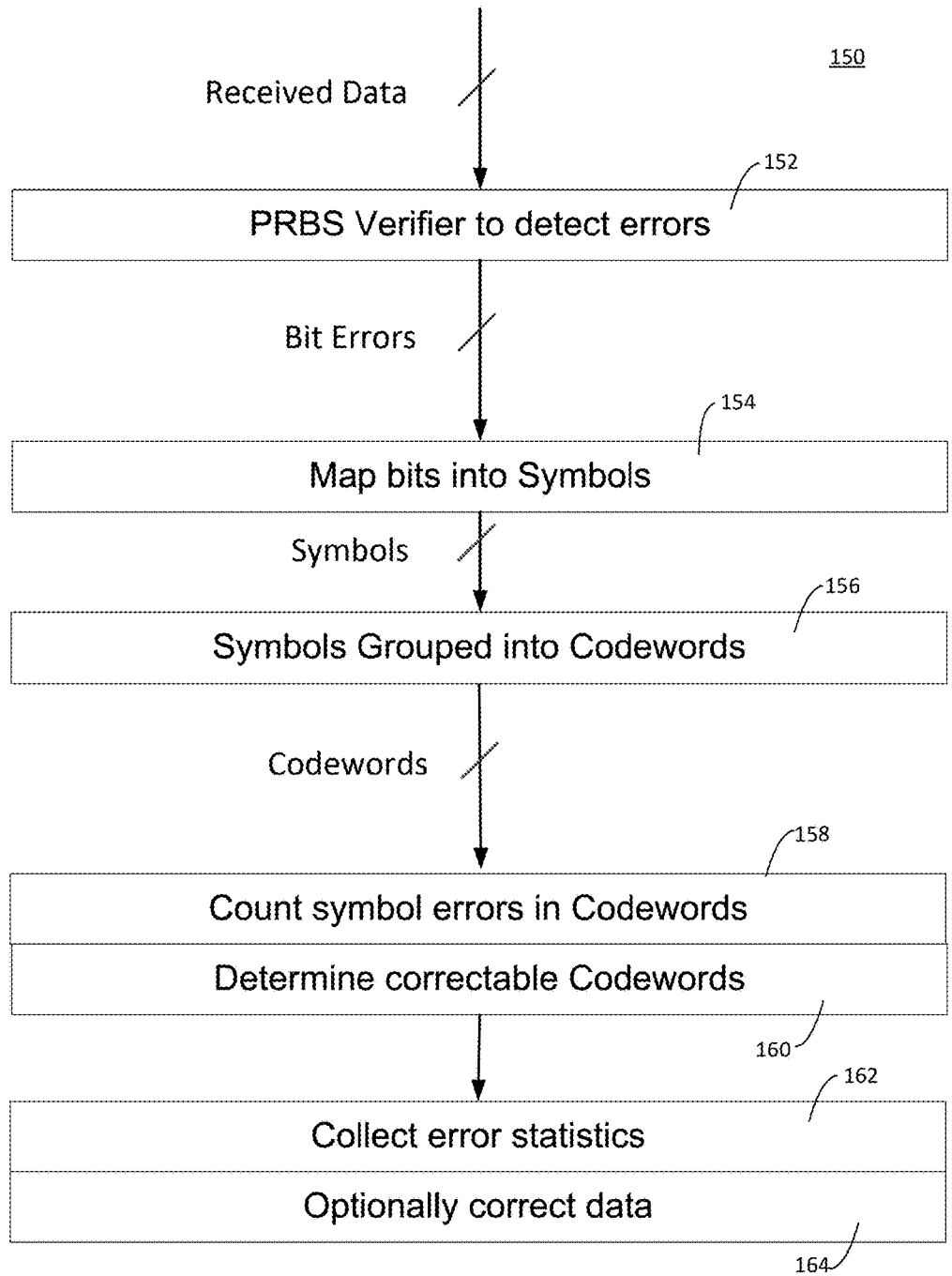

FORWARD ERROR CORRECTION (FEC) EMULATOR

CROSS REFERENCE TO RELATED APPLICATION

This patent application is a continuation of U.S. Nonprovisional patent application Ser. No. 15/337,136, filed Oct. 28, 2016, which is incorporated by reference herein for all purposes.

BACKGROUND

Embodiments of the present invention relate to communication systems. More particularly, embodiments provide an emulator for forward error correction (FEC) techniques.

Over the last few decades, the use of communication networks has increased dramatically. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like FACEBOOK processes more than 500 TB of data daily. With such high demands on data and data transfer, existing data communication systems are to be improved to address these needs.

Recent Ethernet standards use Forward Error Correcting (FEC) codes to improve the Bit Error Ratio (BER) of links. One example of such a correction code is the $GF^{10}$ Reed-Solomon FEC.

Unfortunately, conventional Bit Error Rate Testers (BERTs) may not support the generation of FEC encoded data. Rather, they only produce (and count errors for) Pseudo-Random Binary Sequences (PRBS) patterns.

PRBS are known repeating patterns that allow easy detection of bit errors by comparing the received sequence with a predicted sequence. BERTs use this property to determine the BER of electrical or optical links.

However, the BER performance of new Ethernet standards based on $GF^{10}$ Reed Solomon (RS) FEC may be dependent on the distribution of errors on the link (in particular the "burstiness" of the errors), rather than simply upon the overall BER. This property makes it difficult to predict the post-FEC BER from the pre-FEC BER results produced by a BERT.

SUMMARY

Embodiments relate to the emulation of the effect of Forward Error Correction codes, e.g., $GF^{10}$ Reed Solomon (RS) FEC codes, on the bit error ratio of received pseudo-random binary sequence patterns. Particular embodiments group errors into RS FEC symbols and codewords, in order to determine if the errors are correctable. By emulating the error correction capabilities of FEC codes in order to determine which errors are correctable by the code, embodiments afford a more accurate representation of the post-FEC BER of RS FEC codes from links carrying PRBS patterns. This FEC code emulation can provide error correction statistics, for stand-alone use or for error correction in connection with Bit Error Rate Testers (BERTs).

BRIEF DESCRIPTION OF THE DRAWINGS

FIG. 1B shows a simplified diagram of dataflow according to an embodiment.

DETAILED DESCRIPTION

Figure 1A:
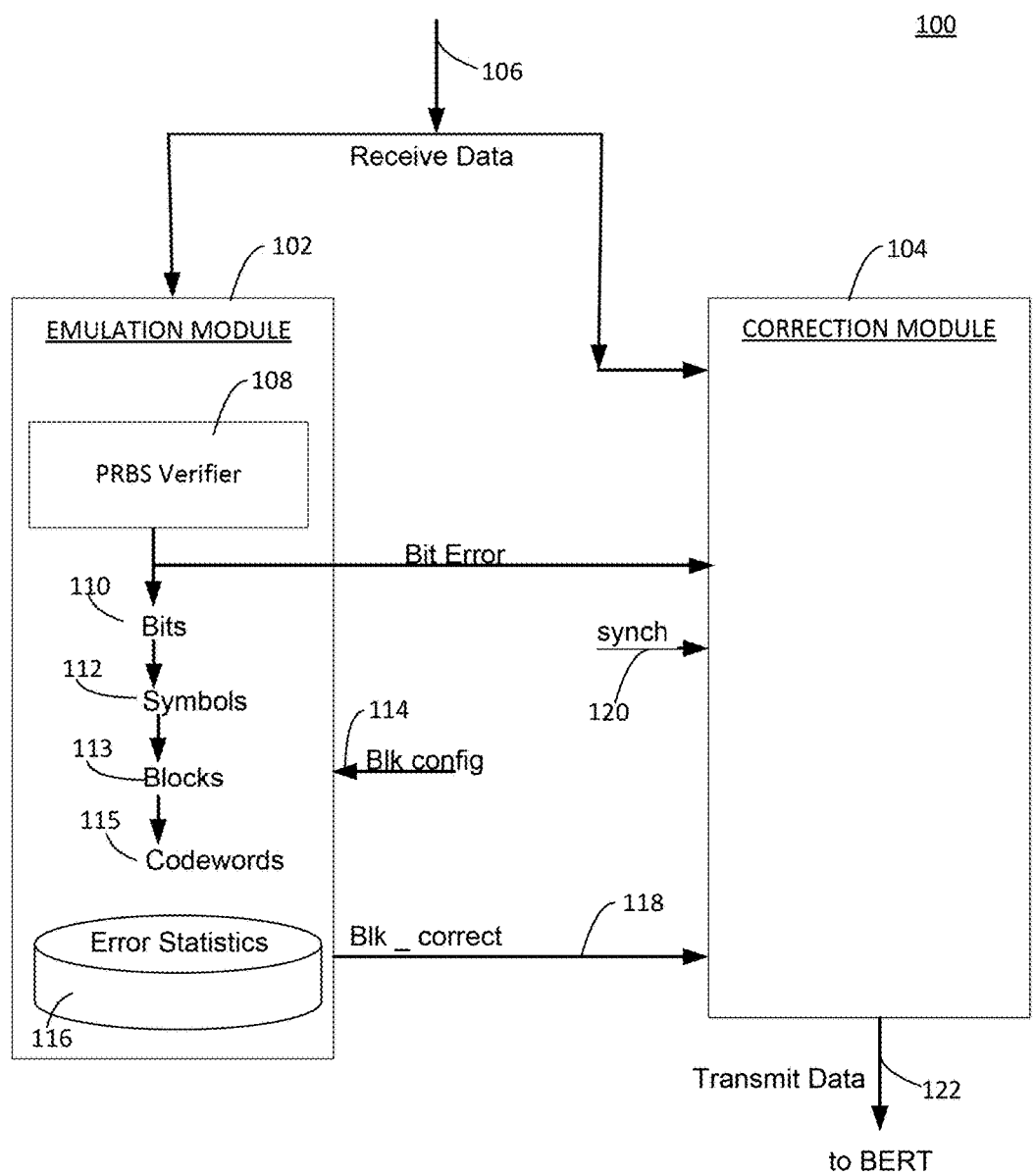
FIG. 1A shows a simplified view of a system according to an embodiment.

Embodiments are directed to apparatuses and methods of emulating forward error correction codes. More specifically, particular embodiments provide emulated forward error correction for Reed Solomon FEC. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Embodiments relate to the emulation of the effect of FEC codes (e.g., $GF^{10}$ Reed Solomon FEC codes) on the BER of received PRBS patterns. By emulating the error correction capabilities of FEC codes to determine which errors are correctable by the code, embodiments afford a more accurate representation of the post-FEC BER of FEC codes from links carrying PRBS patterns. This FEC code emulation provides error correction statistics, for stand-alone use or for error correction in connection with a BERT.

For example, Reed-Solomon FEC codes group bits into symbols, and symbols into FEC codewords. Reed-Solomon FEC codes are characterized by at least the following properties:
 the number of bits in a symbol;
 the number of payload symbols; and
 the total number of symbols in a codeword.

The error correction capability of the code is designated by the variable "t", which represents half the difference between the total number of symbols and the number of payload symbols. This error correction capability (t) is the maximum number of symbol errors that can be corrected. Codewords with greater than "t" errors are considered un-correctable.

Embodiments provide a much more accurate representation of the post-FEC BER of Reed Solomon FEC codes from links carrying PRBS patterns. This is done by grouping errors into RS-FEC symbols and codewords in order to determine if the errors are correctable.

FIG. 1A shows a simplified view of a system according to an embodiment. System 100 comprises an emulation module 102 and a corrector module 104.

The input nodes of both the emulator module and the corrector module are in communication with a receive data bus 106. In particular, a PRBS verifier 108 of the emulator module receives the input data to determine the received bits which are in error.

Next, the error bit data 110 from the PBRS verifier is grouped by the emulation module into symbols 112. The bits are divided into blocks 113 according to a block (blk) configuration signal 114.

The emulator module then groups the symbols into FEC codewords 115. The emulator block module counts a number of symbol errors in a codeword.

Those symbol errors in a codeword are compared to the error correction capability value (t) of the code. This comparison determines whether the codeword is correctable (i.e., whether all of the bit errors in the codeword can be corrected).

Error statistics 116 are collected and stored. At this point in the procedure, the locations of the errored bits that are in fact correctable, are now known. Correction data 118 is accordingly sent to the corrector module.

Based upon a synchronization signal 120 to the correction module, the errored bits are corrected and sent as transmitted data 122 downstream to a BERT for post-FEC correction. This allows the BERT to determine the BER.

FIG. 1B is a simplified flow diagram illustrating a process 150 according to an embodiment. At 152, received data passes through a PRBS verifier circuit in order to determine which received bits are in error.

At 154, the data is then grouped into symbols. Ethernet RS FEC codes use 10 bit symbols.

At 156, the symbols are grouped into FEC codewords. At 158, the number of symbol errors in a codeword is counted.

At 160, the number of symbol errors in a codeword are compared to the t value of the code. This comparison determines whether the codeword is correctable (i.e., whether all of the bit errors in the codeword can be corrected).

At 162, error statistics are collected and stored. At this point in the procedure, the locations of the errored bits that are in fact correctable, are now known.

Thus, at 164 the errored bits are corrected and they are transmitted downstream to a BERT for post-FEC correction. This allows the BERT to determine the BER.

Embodiments are flexible to accommodate different FEC approaches. For example, various embodiments can be configured according to considerations including but not limited to:
 FEC block sizes;
 symbol bit interleaving; and
 2-way FEC block interleaving,
in order to allow a wide range of FEC formats to be supported.

Further details regarding particular embodiments are now provided. Embodiments comprise a FEC emulation module and a FEC correction module per lane.

Figure 2:
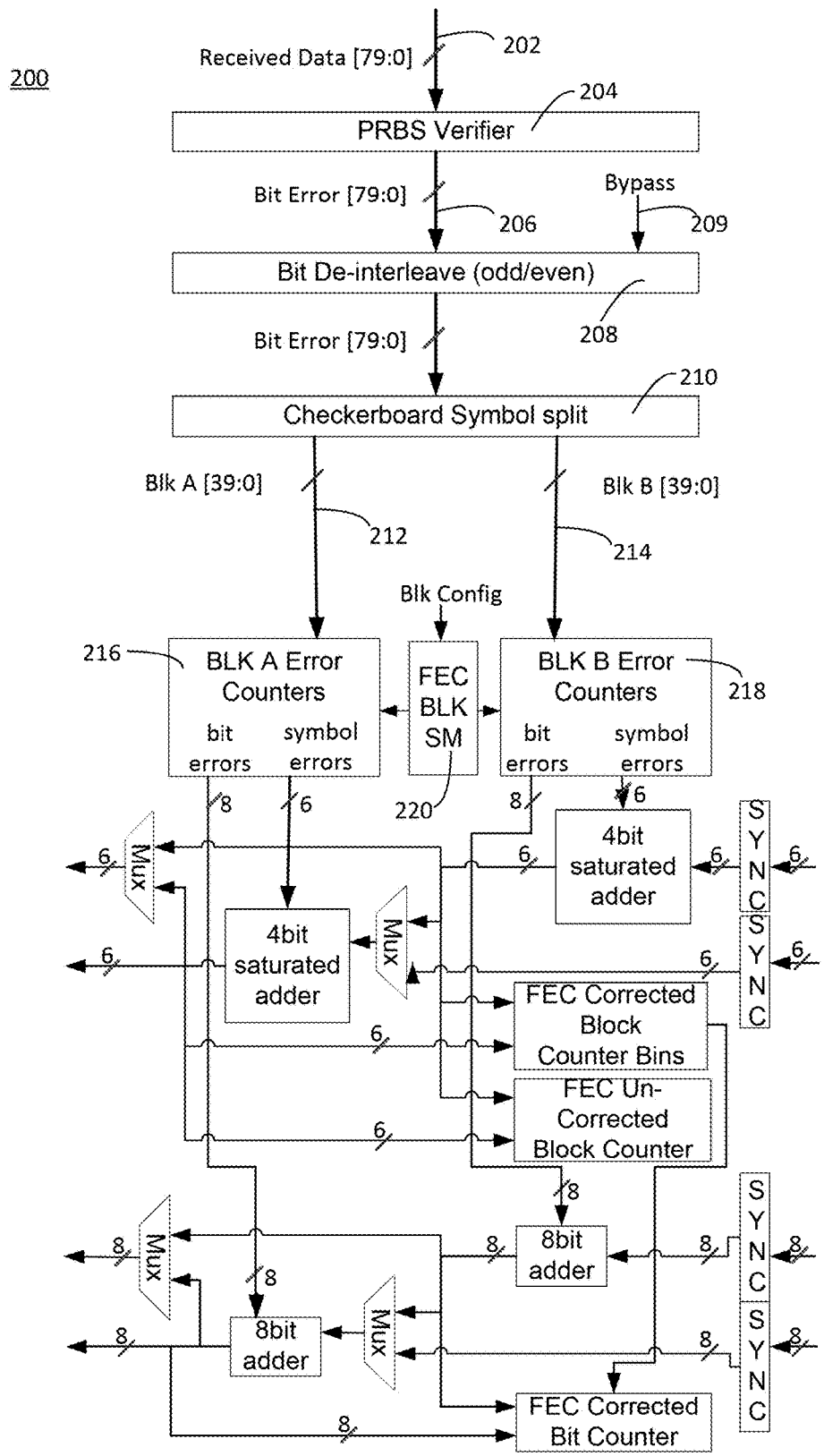
FIG. 2 shows an embodiment of a FEC emulation module.

The FEC emulation module is illustrated in FIG. 2. That figure shows a particular FEC emulation module 200 which emulates the effect of a $GF^{10}$ RS-FEC by processing bit errors detected in a received PRBS pattern.

This determines the equivalent number of 10 bit symbol errors in a given block size. Based upon the number of correctable symbol errors (t) for a code, this also determines whether that block is correctable or not.

In FIG. 2 the receive data bus 202 width is 80 bits wide (equivalent to eight 10 bit symbols). However, wider or narrower bus widths could be used.

Specifically, error processing is simplified by processing an integral number of 10 bit symbol pairs. Accordingly a bus-width gearbox located before or after the PRBS verifier 204 could be employed to achieve such a bus width.

De-serialized Receive data for the lane, is processed by a PRBS verifier in order to generate a data bus 206 indicating errored bits in the received data. The PRBS verifier implements at least the standard set of PRBS sequences (PRBS7, PRBS15, PRBS23, PRBS31, and their inverses) that are supported by test equipment.

The verifier locks to the received PRBS pattern. It then generates the expected sequence in order to determine errored bits in the received sequence.

Some Ethernet protocols (e.g., 100G Ethernet over a 50G PAM4 lane) bit interleave two 10 bit symbols onto a lane. The bit-de-interleave stage 208 (which can be bypassed according to signal 209) supports these Ethernet protocols by creating eight 10 bit symbols from the odd and even bits of the input data.

The 8 symbol error bus is then optionally checkerboard de-interleaved by stage 210 into two FEC block streams 212, 214. This supports the 2-way FEC block interleaving used in 200G and 400G Ethernet protocols.

Statistics for two interleaved FEC blocks (Blk A and Blk B) are then accumulated separately. Non-interleaved protocols add Blk A and Blk B results together later, in order to obtain the result for a single block.

There are two FEC Error counters: "Blk A Error Counters" 216, and "Blk B Error Counters" 218. These support two interleaved FEC blocks, or two halves of a single FEC block.

Both counters are sequenced by the "FEC BLK State Machine (SM)" 220. This determines FEC block boundaries.

Each block error counter operates on four 10 bit symbols per clock cycle. The counter accumulates the number of symbol and bit errors per "n" data words, where "n" is determined by the FEC block size.

The symbol error counter saturates at 16. This supports values of t≤15.

The bit error counter is 8 bits. It saturates at 255, thereby supporting values of t≤15. (The maximum number of bit errors in fifteen 10 bit symbols is 150).

The remainder of the lane of FIG. 2 compromises the lane-to-lane daisy chain adder logic, and the total error counter registers. The lane-to-lane daisy chain adder logic adds BlkA and BlkB symbol and bit error counts (with saturation) right to left across a group of lanes.

Figure 4:
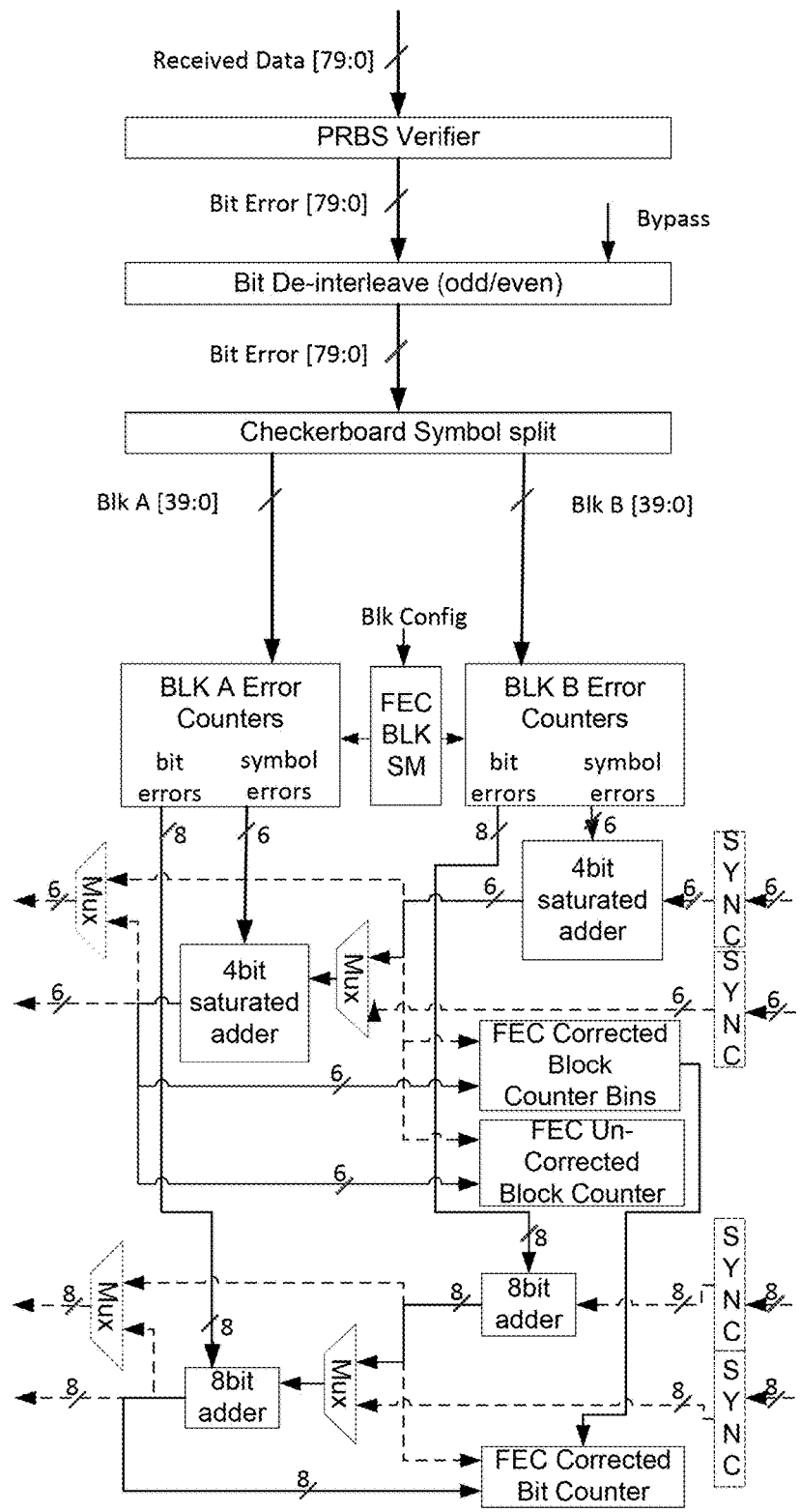
FIG. 4 shows the use an emulation lane in isolation.
Figure 5:
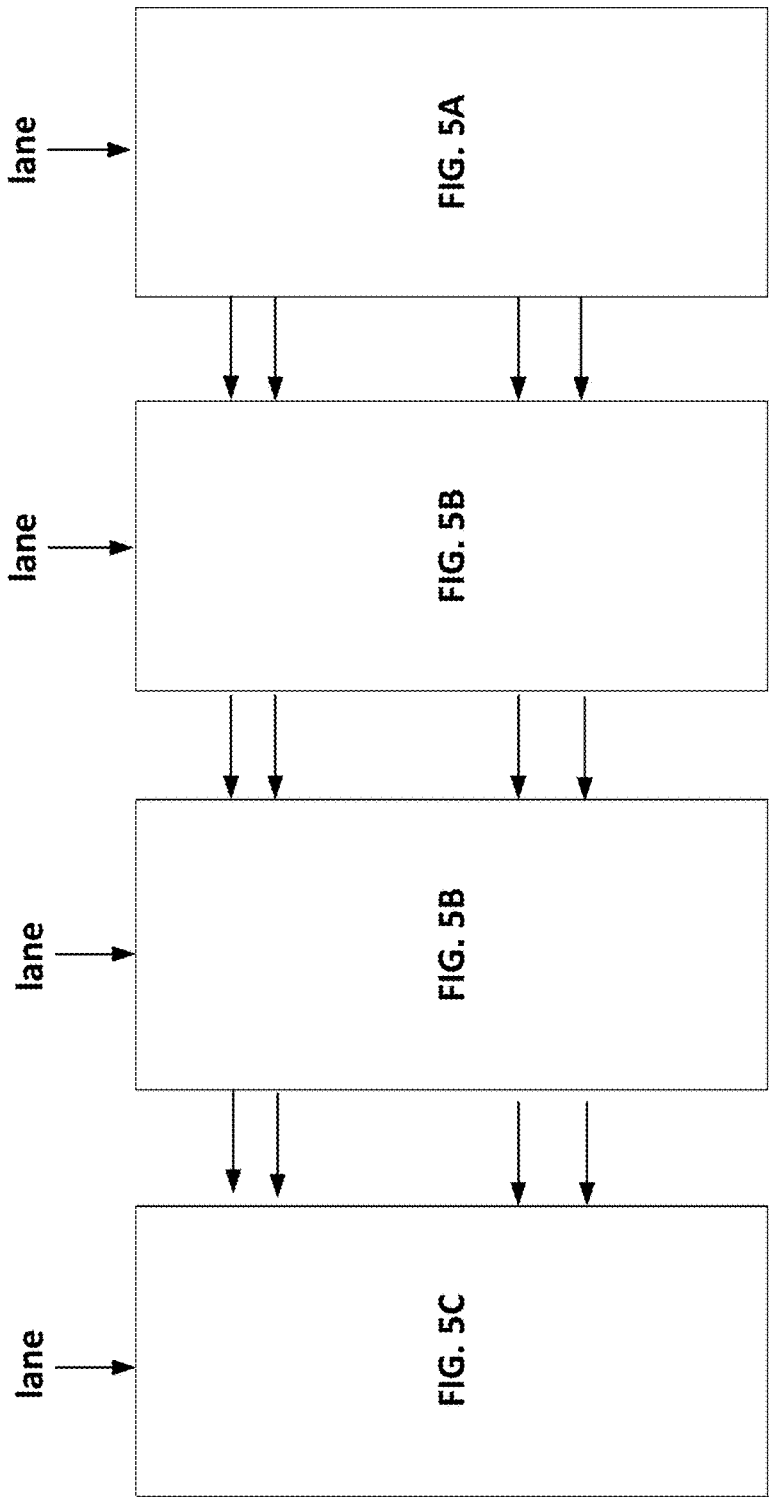
FIGS. 5-5C show cascading of an emulation lane to support a multi-lane link.
Figure 5A:
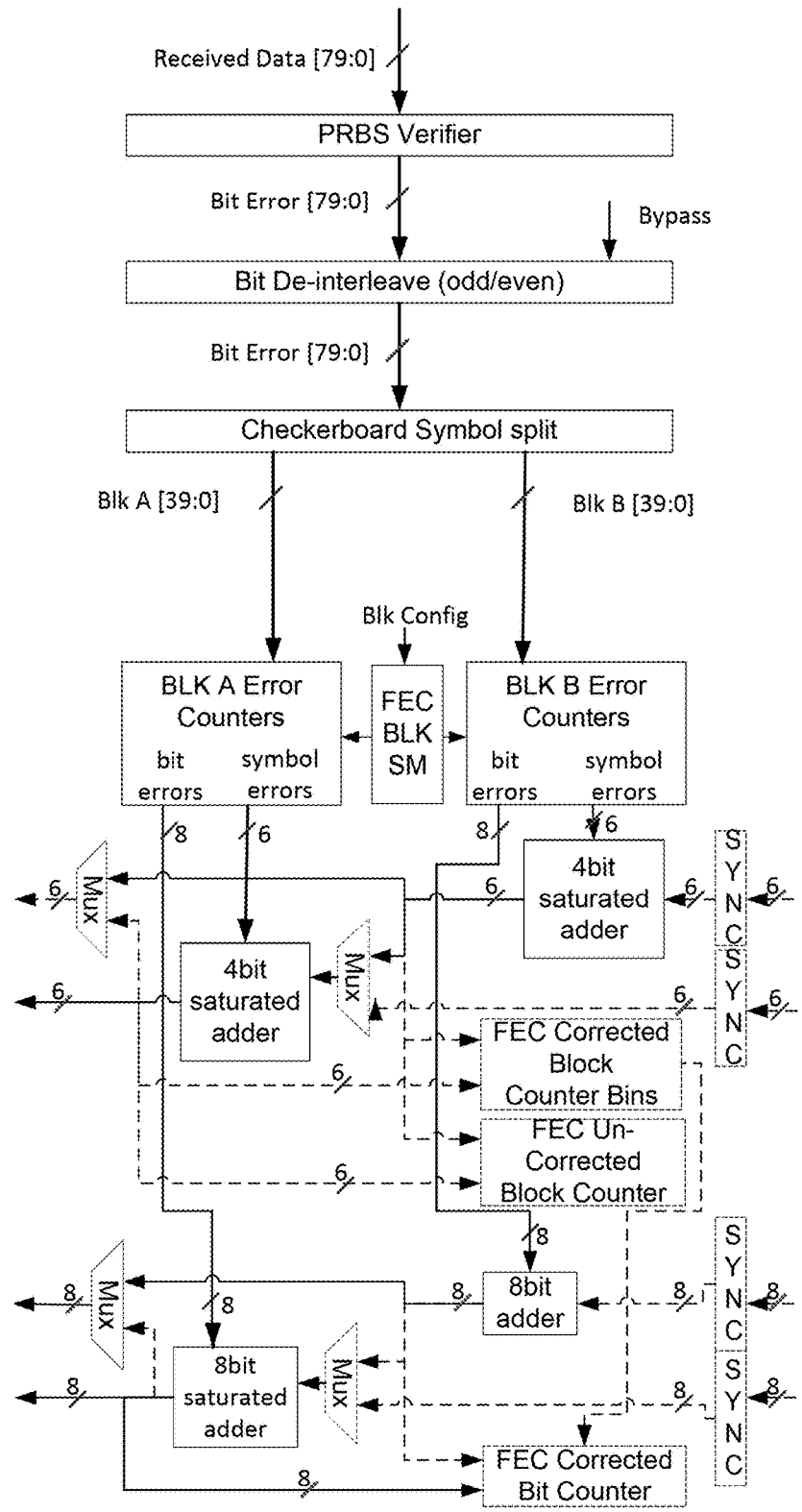
Figure 5B:
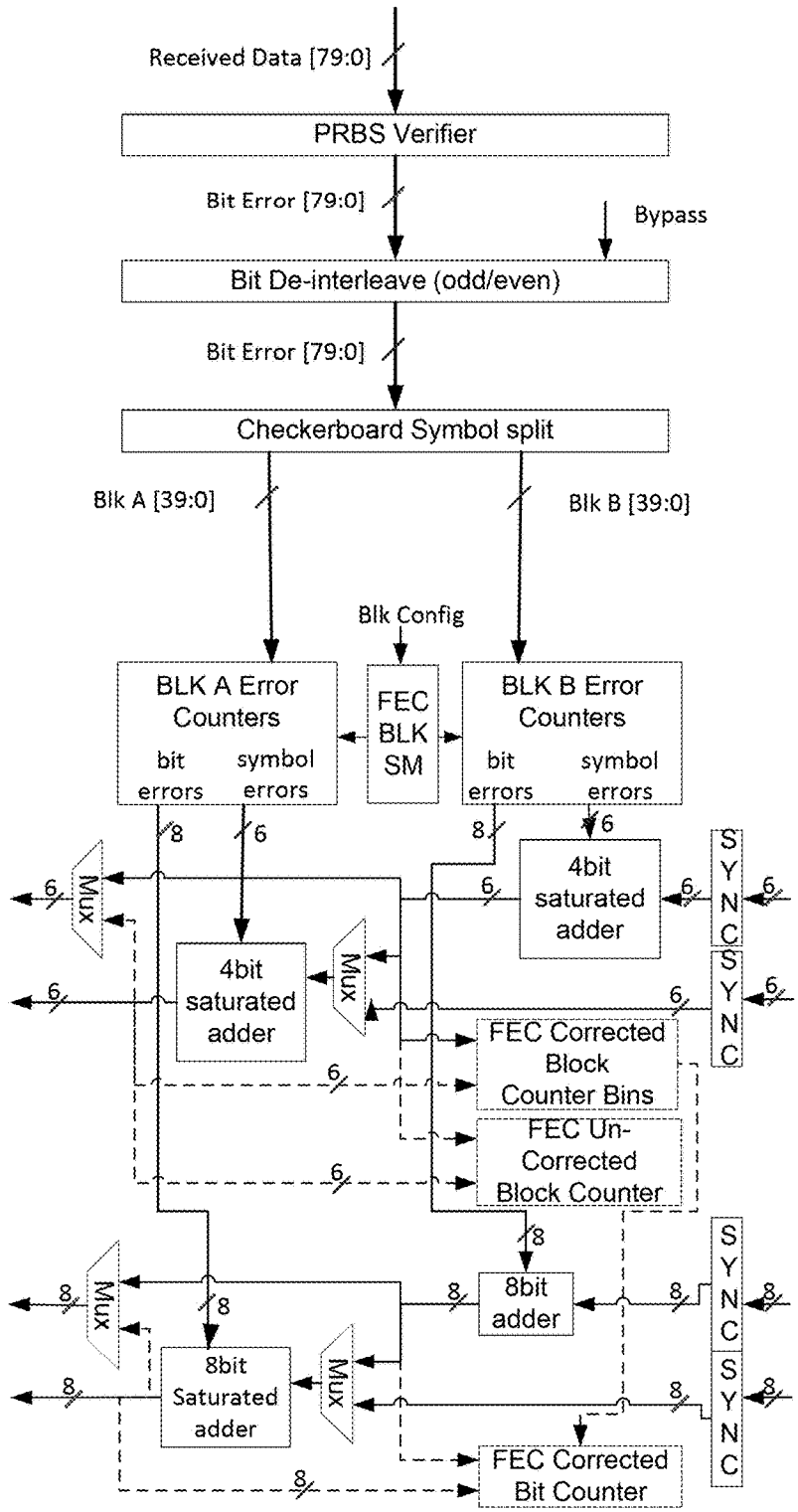
Figure 5C:
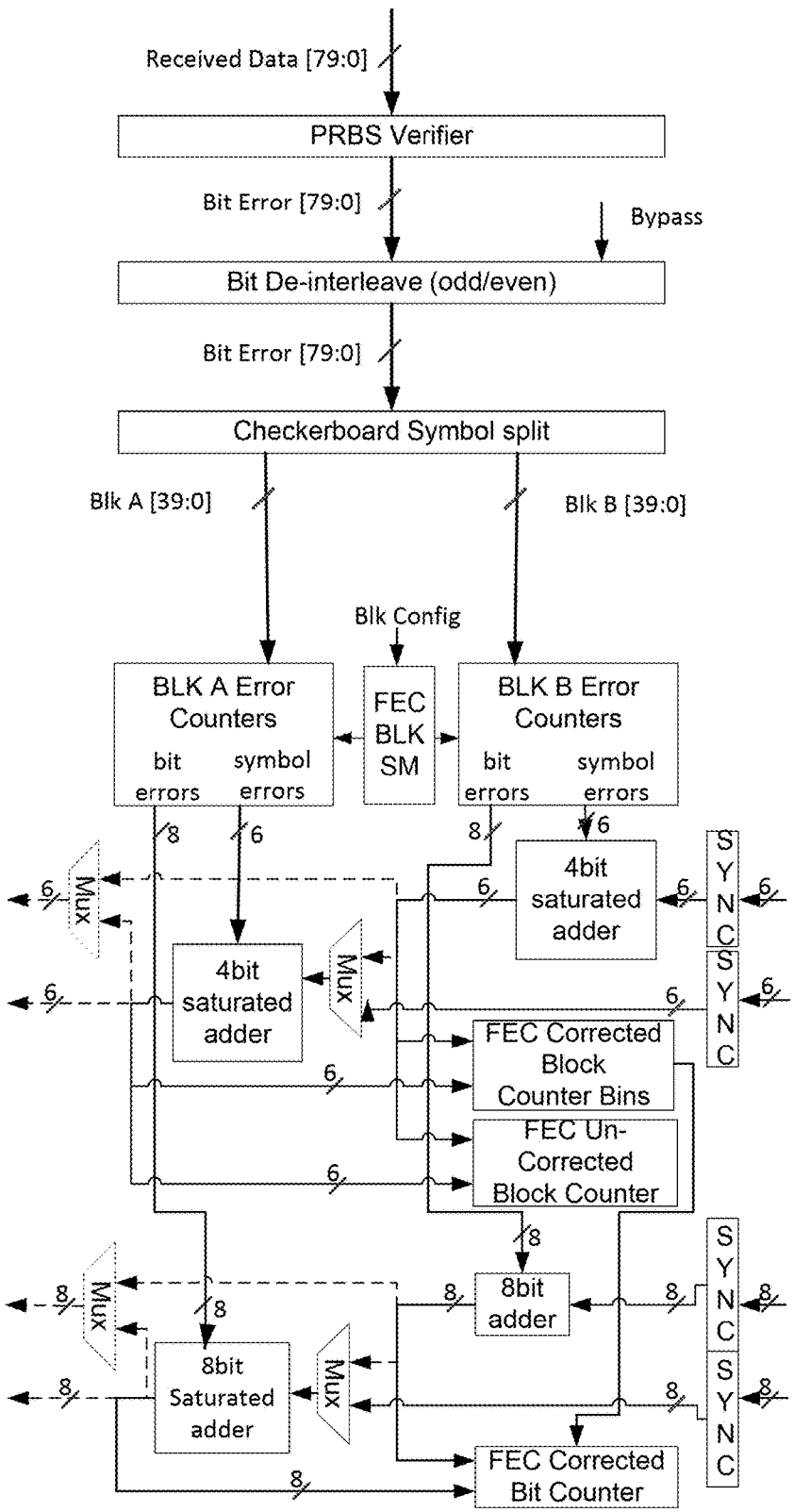

The final lane increments its error counters based on the total result for all lanes. Operation of the daisy chain adder logic is illustrated in FIGS. 4-5C and their associated descriptions which are provided further below.

The FEC uncorrected block error counter is incremented for all blocks with a total symbol error count greater than t, or if the count is saturated (where t is a configuration option in the range 1 to 15).

The FEC corrected block error counter bins are a set of 15 counters which separately count blocks with 1 to 15 symbol errors. The FEC corrected bit error counter is incremented by the number of errors in a block for all blocks with a symbol error count less than equal to t.

The daisy-chain can be configured to add Blk A and Blk B results together for non-block interleaved protocols. FIG. 4 and accompanying text (below) provide further details regarding this aspect.

In addition to collecting FEC block statistics, the final FEC emulation module in a daisy chain creates block correction signals for Blk A and Blk B. These block correction signals are for use by the FEC correction modules associated with the lanes.

Figure 3:
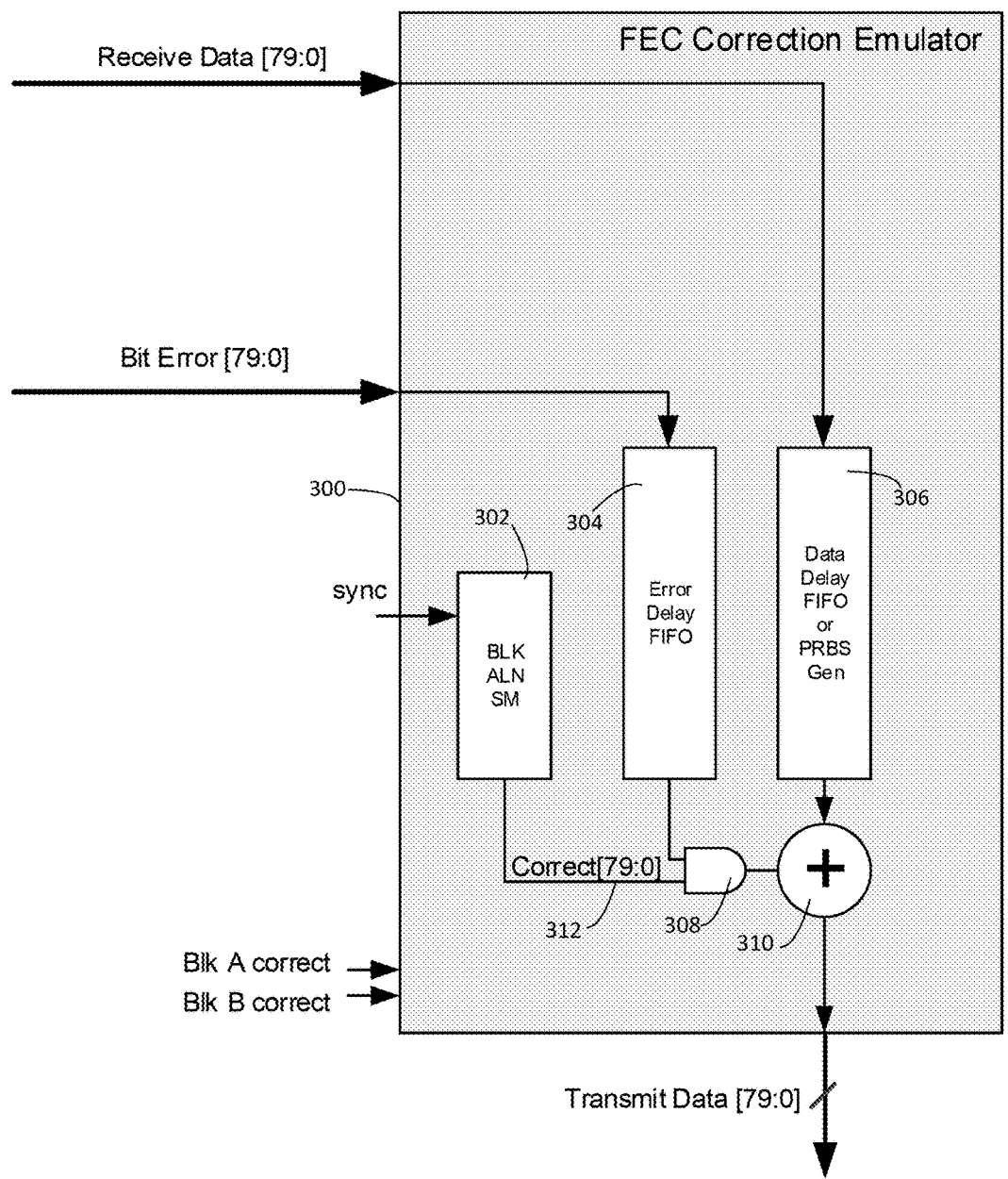
FIG. 3 shows an embodiment of a FEC correction module.

FIG. 3 shows the FEC correction module which uses the results of the FEC emulation block(s) in order to correct lane errors. The FEC correction module 300 comprises of the Block (BLK) Alignment (ALN) State Machine (SM) 302, two delay FIFOs 304, 306, AND gate 308, and XOR gate(s) 310.

The delay FIFOs delay the Receive data and the detected bit error bus, by sufficient time for the FEC emulation module(s) to determine whether the current FEC block should be corrected or not.

The BLK ALN SM is synchronized (but time delayed) to the corresponding lanes FEC emulator FEC block SM (220 in FIG. 2). This allows operation of these state machines on the same data blocks as they exit the delay FIFOs.

The BLK ALN SM produces a Correction bit mask bus 312 to determine which data bits to correct, allowing for bit and FEC block interleaving. This bit mask Correct[79:0] is AND'ed with the delayed error bus and then XOR'ed with the delayed receive data in order to effect data correction.

FIG. 4 is a simplified view illustrating single lane FEC correction, with no FEC block interleaving. That figure illustrates how a single lane of the FEC correction emulator can accumulate FEC error statistics for a 50G link. In order to highlight the active paths, the unused/disabled parts of the daisy chain are shown dashed.

50G Ethernet is being standardized by IEEE P802.3cd. 50G Ethernet is based on two 25G FEC lanes with no FEC block interleaving.

Incoming Receive data buses on each lane carry two bit-interleaved 25G FEC lanes. Accordingly, the bit de-interleaving function is required.

No FEC block interleaving is required by 50G Ethernet. So, partial counts for Blk A and Blk B are summed together before being added to the counters.

Blk A and Blk B counts for the right lane are summed to produce the total counts for a block.

The total counts for the 50G link are accumulated in the lane's counters.

Certain interface standards distribute FEC code symbols across a group of lanes. For example, 200G Ethernet is being standardized by IEEE P802.3bs. 200G Ethernet is based on 8×25G FEC lanes with 2-way FEC block interleaving.

Accordingly, embodiments as described herein are modular and allow FEC correction emulation across adjacent lanes. FIG. 5 is a simplified view of multi-lane FEC correction with 2-way FEC block interleaving. FIGS. 5A-C show detailed lane views.

FIGS. 5-5C illustrate how the FEC monitoring IP in four 50G lanes, can accumulate FEC error statistics for a 200G link. Again, in order to highlight the active paths the unused/disabled parts of the daisy chain are shown as dashed.

Incoming Receive data buses on each lane carry two bit-interleaved 25G FEC lanes. Accordingly, here the bit de-interleaving function is required.

Two-way FEC block interleaving is used. This calls for Blk A and Blk B counts to be accumulated separately across all lanes.

Blk A and Blk B (symbol and bit error) counts from the right-most lane (FIG. 5A) are passed separately to the left.

The middle two lanes (FIG. 5B) add Blk A and Blk B counts to the incoming Blk A and Blk B counts from their right, and pass them to their left.

The left-most lane (FIG. 5C) adds its Blk A and Blk B counts to the incoming Blk A and Blk B counts from the right, in order to produce the total counts for a block.

The Total counts for the 200G group are accumulated in the left-most lane's counters (FIG. 5C).

While the above is a full description of the specific embodiments, various modifications, alternative constructions and equivalents may be used. For example, while the examples have focused upon emulation of $GF^{10}$ Reed Solomon FEC error correction codes, this is not required.

Possible examples of other types of FEC schemes which may be suited for embodiments can include but are not limited to symbol oriented FEC codes such as Reed Solomon codes, and bit oriented codes such as BCH code, and Block codes such as Golay, Multidimensional parity, and Hamming codes. Accordingly, the above description and illustrations should not be taken as limiting the scope of the present invention which is defined by the appended claims.

What is claimed is:

1. A communications system comprising:
    an emulator module passing received data through a pseudo-random bit sequence (PRBS) verifier to determine error bits;
    one or more modules configured for grouping the data into symbols according to a forward error correction (FEC) code, wherein the FEC code comprises a $GF^{10}$ Reed Solomon FEC code;
    grouping the symbols into codewords according to the FEC code;
    counting a number of symbols in a codeword having error bits;
    comparing the number of symbols having error bits to an error correction capability value to determine whether the codeword is correctable;
    storing error statistics based upon the comparing;
    generating a correction signal from the error statistics; and
    forwarding the correction signal to a correction module also having the received data and the error bits as inputs, the correction module comprising an AND gate and an exclusive OR (XOR) gate; and
    the correction module processing the received data according to the correction signal and the error bits to output a corrected data stream to a bit error rate tester, wherein, a first delay First-In First-Out (FIFO) of the correction module delays the error bits to produce a delayed error bus, a second delay FIFO of the correction module delays the received data to produce delayed received data, and in response to a synchronization signal received from the emulator module, a block alignment state machine of the correction module produces a correction bit mask bus that is combined using the AND gate with the delayed error bus, a product of which is then combined using the XOR gate with the delayed received data in order to create the corrected data stream.

2. A communications system comprising:

an emulator module passing received data through a pseudo-random bit sequence (PRBS) verifier to determine error bits;

one or more modules configured for grouping the data into symbols according to a forward error correction (FEC) code;

grouping the symbols into codewords according to the FEC code;

counting a number of symbols in a codeword having error bits;

comparing the number of symbols having error bits to an error correction capability value to determine whether the codeword is correctable, wherein the error correction capability value comprises half of a difference between a total number of symbols and a number of payload symbols;

storing error statistics based upon the comparing;

generating a correction signal from the error statistics; and forwarding the correction signal to a correction module also having the received data and the error bits as inputs, the correction module comprising an AND gate and an exclusive OR (XOR) gate; and the correction module processing the received data according to the correction signal and the error bits to output a corrected data stream to a bit error rate tester, wherein, a first delay First-In First-Out (FIFO) of the correction module delays the error bits to produce a delayed error bus, a second delay FIFO of the correction module delays the received data to produce delayed received data, and in response to a synchronization signal received from the emulator module, a block alignment state machine of the correction module produces a correction bit mask bus that is combined using the AND gate with the delayed error bus, a product of which is then combined using the XOR gate with the delayed received data in order to create the corrected data stream.

3. The system of claim 2 further comprising:
dividing the symbols into a plurality of blocks; and
interleaving the plurality of blocks.

4. The system of claim 2 further comprising performing bit de-interleaving of data received from the PRBS verifier.

5. A communications system comprising:

an emulator module passing received data through a pseudo-random bit sequence (PRBS) verifier to determine error bits;

one or more modules configured for grouping the data into symbols according to a forward error correction (FEC) code;

grouping the symbols into codewords according to the FEC code;

counting a number of symbols in a codeword having error bits;

comparing the number of symbols having error bits to an error correction capability value to determine whether the codeword is correctable;

storing error statistics based upon the comparing;

the emulator module generating a correction signal from the error statistics; and the emulator module forwarding the correction signal to a correction module also having the received data and the error bits as inputs, the correction module comprising an AND gate and an exclusive OR (XOR) gate, the method further comprising the correction module processing the received data according to the correction signal and the error bits to output a corrected data stream to a bit error rate tester, wherein, a first delay First-In First-Out (FIFO) of the correction module delays the error bits to produce a delayed error bus, a second delay FIFO of the correction module delays the received data to produce delayed received data, and in response to a synchronization signal received from the emulator module, a block alignment state machine of the correction module produces a correction bit mask bus that is combined using the AND gate with the delayed error bus, a product of which is then combined using the XOR gate with the delayed received data in order to create the corrected data stream.

6. The system of claim 5 wherein the FEC code comprises a Reed Solomon FEC code.

7. The system of claim 6 wherein the Reed Solomon FEC code comprises a $GF^{10}$ Reed Solomon FEC code.

8. The system of claim 5 wherein the error correction capability value comprises half of a difference between a total number of symbols and a number of payload symbols.

9. The system of claim 5 further comprising:
dividing the symbols into a plurality of blocks; and
interleaving the plurality of blocks.

10. The system of claim 5 further comprising performing bit de-interleaving of data received from the PRBS verifier.

11. The system of claim 1 wherein the error correction capability value comprises half of a difference between a total number of symbols and a number of payload symbols.

12. The system of claim 2 further comprising:
dividing the symbols into a plurality of blocks; and
interleaving the plurality of blocks.

13. The system of claim 2 further comprising performing bit de-interleaving of data received from the PRBS verifier.

14. The system of claim 2 wherein the FEC code comprises a Reed Solomon FEC code.

* * * * *